United States Patent
Müeller et al.

(10) Patent No.: US 11,639,953 B2
(45) Date of Patent: May 2, 2023

(54) METHOD AND SYSTEM FOR SIDEBAND CORRECTED NOISE-POWER MEASUREMENT

(71) Applicant: Rohde & Schwarz GmbH & Co. KG, Munich (DE)

(72) Inventors: Daniel Müeller, Munich (DE); Ulrich Tüerk, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 21 days.

(21) Appl. No.: 17/172,529

(22) Filed: Feb. 10, 2021

(65) Prior Publication Data

US 2022/0252651 A1   Aug. 11, 2022

(51) Int. Cl.
*G01R 27/32* (2006.01)
*G01R 23/20* (2006.01)
*G01R 23/163* (2006.01)

(52) U.S. Cl.
CPC ........... *G01R 27/32* (2013.01); *G01R 23/163* (2013.01); *G01R 23/20* (2013.01)

(58) Field of Classification Search
CPC .... H04L 67/02; H04L 27/3863; H04B 1/0475
See application file for complete search history.

(56) References Cited

U.S. PATENT DOCUMENTS

| | | | |
|---|---|---|---|
| 3,337,804 A * | 8/1967 | Palatinus | G01R 29/06 455/115.2 |
| 4,403,348 A * | 9/1983 | Leland | H04B 1/68 455/239.1 |
| 4,491,783 A | 1/1985 | Sawayama et al. | |
| 4,837,498 A | 6/1989 | Faulkner et al. | |
| 4,998,071 A | 3/1991 | Strid et al. | |
| 5,053,714 A | 10/1991 | Durand | |
| 5,191,294 A | 3/1993 | Grace et al. | |
| 5,416,422 A | 5/1995 | Dildine | |
| 2002/0094044 A1 | 7/2002 | Kolze et al. | |
| 2006/0195279 A1 | 8/2006 | Feldhaus et al. | |
| 2008/0090531 A1 * | 4/2008 | Jungerman | H04L 27/364 455/126 |
| 2010/0237884 A1 | 9/2010 | Bult et al. | |

(Continued)

FOREIGN PATENT DOCUMENTS

DE   102018128644 A1   5/2020

OTHER PUBLICATIONS

Collins, et al., "A New Method for Determination of Single Sideband Noise Figure", 1994 IEEE MTT-S Digest, Department of Electronic and Electrical Engineering, University of Leeds, UK,, 1994.

*Primary Examiner* — Jermele M Hollington
*Assistant Examiner* — Temilade S Rhodes-Vivour
(74) *Attorney, Agent, or Firm* — Potomac Technology Law, LLC

(57) ABSTRACT

A method and a measurement system for determining the noise power of a device under test especially the exact noise power is provided. The measurement method comprises determining a sideband gain of a measurement system using a calibration unit, connecting a device under test to the measurement system, measuring a noise power of the device under test with a receiver and correcting the measured noise power with the determined system gain including a sideband gain.

16 Claims, 8 Drawing Sheets

(56) References Cited

U.S. PATENT DOCUMENTS

2012/0315049 A1* 12/2012 Banwell ........... H04B 10/25759
398/115
2016/0104493 A1* 4/2016 Kim ....................... H04S 3/008
381/22
2017/0077971 A1 3/2017 Roth et al.

* cited by examiner

METHOD AND SYSTEM FOR SIDEBAND CORRECTED NOISE-POWER MEASUREMENT

TECHNICAL FIELD

The invention relates to determining the noise power of a device under test especially the exact noise power at a desired frequency.

BACKGROUND

For noise figure measurements the gain and noise power at the output of the DUT have to be known. While the gain measurement is well established, the noise power measurement has more challenges. This is especially true in case of vector network analyzers, which typically use receivers without image band suppression and without suppression of higher order sidebands.

The document DE102018128644A1 shows a method for removing at least one unwanted signal component from a measurement signal at the output of a measurement object (device under test). The method first measures a measurement signal with a measurement unit at the output of the measurement object, with a measurement signal having a first frequency being applied to the measurement object at its input. A second measurement of the measurement signal is then performed at the output of the measurement object. The measurement object has a measurement signal with a second frequency applied to its input for the second measurement. This second frequency is different from the first frequency. The two measurements are performed with an unchanged measurement setup. The output signal is generated at the output of the measuring object in the first measurement and contains signal components that are to be measured and also signal components that are unwanted. In the second measurement, a second frequency is selected in such a way that the unwanted signal components are generated at the output of the measurement object, which are generated during the first measurement. The measurement results of the second measurement are subtracted from the measurement results of the first measurement. The subtraction of the second measurement, which contains the unwanted signal parts, from the first measurement, which contains the wanted and unwanted signal parts, results in a measurement result, which contains only the wanted signal parts. The noise power is inherently measured in all sidebands of the receiver and is converted down to the intended intermediate frequency. This however introduces an unknown increase in measured noise power which is falsely accounted to the intended RF frequency.

Accordingly, there is a need to provide a method and system for determining an accurate noise figure of an electronic device, which require only minimal hardware and computational complexity.

SUMMARY

Embodiments of the present invention advantageously address the foregoing requirements and needs, as well as others, by providing a method and system for determining an accurate noise figure of an electronic device, which require only minimal hardware and computational complexity.

According to a first aspect of the invention, a method for determining the noise power of a device under test especially the exact noise power is provided. The measurement method comprises determining a sideband gain of a measurement system, connecting a device under test to the measurement system, measuring a noise power of the device under test at an intended measurement frequency and in at least one sideband and correcting the measured noise power with the measured noise power with the measured noise power in the at least one sideband and the determined sideband gain. It is therefore possible to enhance accuracy of the noise power measurement with a minimum of measurement equipment.

According to a preferred implementation form of the first aspect, the method comprises the step of performing an at least partial vector calibration of the measurement system. Advantageously, this allows for an increase in accuracy of the noise power measurement.

According to a further preferred implementation form of the first aspect, the method comprises calibrating a power measurement on an intended measurement frequency and calibrating a power measurement on a frequency of at least one sideband within the partial vector calibration. Advantageously, the precision is further increased with respect to a frequency dependency of the noise power measurement.

According to a further preferred implementation form of the first aspect of the sideband gain determination of the measurement method comprises tuning the measurement system to at least one local oscillator frequency, wherein the at least one local oscillator frequency is tuned for the intended measurement frequency, applying a calibration signal to the measurement system and measuring the sideband gain for at least one sideband at least one of the sideband frequency. Herein, the calibration signal is tuned to at least one sideband frequency. Advantageously, the measurement failures can be exactly determined and therefore the precision is further increased with respect to a frequency dependency of the noise power measurement.

According to a further preferred implementation form of the first aspect, the measurement method comprises tuning the measurement system to the intended measurement frequency, measuring the contribute of the noise-power to an intended measurement frequency, tuning the measurement system to at least one sideband frequency and measuring the noise power at least one of these frequencies. Advantageously, every fraction of the noise signal can be exactly analyzed and included to a measurement error compensation.

According to a further preferred implementation form of the first aspect, the step of measuring noise power further comprises correcting the noise power measurement with the previously performed calibration. Advantageously, the systematic errors of the measurements are eliminated leading to a high precision measurement.

According to a further preferred implementation form of the first aspect, the noise power measurement determined without image suppression is corrected by dividing the measured noise power by two. Advantageously, the characteristics of a mixing device are fully considered to get a precise measurement.

According to a further preferred implementation form of the first aspect, the measured noise power is corrected by weighing the measured noise at the sideband frequencies. Correcting the measured noise power at the sideband frequencies is based on weighing the measured noise with the gain of one of the RF band or image band. The precision of correcting the measured noise power is further enhanced by weighing the measured noise at the sideband frequencies with a mean gain of the corresponding sideband while the measurement system is focused at an intended measurement frequency and subtracting the weighed measured noise at the sideband frequencies from the total noise power at the intended measurement frequency. Advantageously, subtracting the weighted sideband noise power leads to a high precision measurement of the noise power where each content of the sidebands is fully considered.

According to a further preferred implementation form of the first aspect, the correcting of the measured noise power comprises calculating a noise figure of the device under test. Advantageously, the noise figure base on the corrected measured noise power makes a noise calculation of a system, wherein the device under is incorporated, highly accurate.

According to a second aspect of the invention, a measurement system for sideband corrected noise-power measurement comprises a calibration unit configured to determine a sideband gain of the measurement system, a receiver configured to measure a noise power of a device under test and a controller for correcting the noise power measurement. Advantageously, it is therefore possible to enhance accuracy of the noise power measurement with a minimum of measurement equipment.

According to a first preferred implementation form of the second aspect, the calibration unit of the measurement system is adapted to perform at least a partial vector calibration of the measurement system. Therefore, a tunable frequency generator is stimulating a receiver input of the measurement system with a well-known signal controlled by the calibration unit. The signal detected by the receiver is provided to the calibration unit for evaluation. The results are used to correct the measurement results. Advantageously, the precision of the measuring system is highly improved.

According to a further preferred implementation form of the second aspect, the receiver of the measurement system comprises a mixer having a first input, a second input and an output, a local oscillator and a power detector. The local oscillator frequency is tuned by a controller. The first port of the mixer is connectable to a device under test. The second port of the mixer is connected to the local oscillator, and the output port is connected to the power detector. Advantageously, the calibration of the measuring system with respect to sideband components is tied to an extraordinary precision.

According to a further preferred implementation form of the second aspect, the calibration unit comprises a tunable frequency generator. The tunable frequency generator has an output port connectable to the first input port of the mixer. The tunable frequency generator is tuned to an intended measurement frequency while measuring a gain of the measuring system at an intended measurement frequency or it is tuned to at least one sideband frequency while measuring a sideband gain for at least one sideband of the measuring system at the frequency of the at least one sideband. It is therefore possible to enhance accuracy of the noise power measurement with a minimum of measurement equipment.

According to a further preferred implementation form of the second aspect, the local oscillator of the receiver is tuned to a frequency corresponding to the intended measurement frequency while measuring the contribute of the noise power at the intended measurement frequency. The local oscillator of the receiver is further tuned to a frequency corresponding to at least one sideband frequency while measuring the contribute of the noise-power at the sideband frequency. Advantageously, every fraction of the noise signal can be exactly analyzed and included to a measurement error compensation.

According to a further preferred implementation form of the second aspect, the controller is configured to correct the noise power measurement at the intended frequency by the contribute of the noise-power at the sideband frequency on the basis of the measured sideband gain. Advantageously, the systematic errors of the measurements are eliminated leading to a high precision measurement.

According to a further preferred implementation form of the second aspect, the controller is configured to correct the noise power measurement of the receiver being a non-image suppressing receiver by dividing the measured noise power by two. Advantageously, the characteristics of a mixing device are fully considered to get a precise measurement.

According to a further preferred implementation form of the second aspect the measurement system for sideband corrected noise-power measurement comprises a weighing unit configured to weight the measured noise at the sideband frequencies with the mean gain of the corresponding sideband while the measurement system was focused at the intended measurement frequency. The weighed measured noise at the sideband frequencies is subtracted from the total noise power at the intended measurement frequency. Advantageously, subtracting the weighted sideband noise power leads to a high precision measurement of the noise power where each content of the sidebands is fully considered.

According to a further preferred implementation form of the second aspect, the controller is configured to calculate a noise figure of the device under test. Advantageously, the systematic errors of the measurements are eliminated leading to a high precision measurement.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with respect to the drawings by way of example only, and not for limitation. In the drawings.

DETAILED DESCRIPTION

A method and system for determining an accurate noise figure of an electronic device, which require only minimal hardware and computational complexity, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Figure 1:
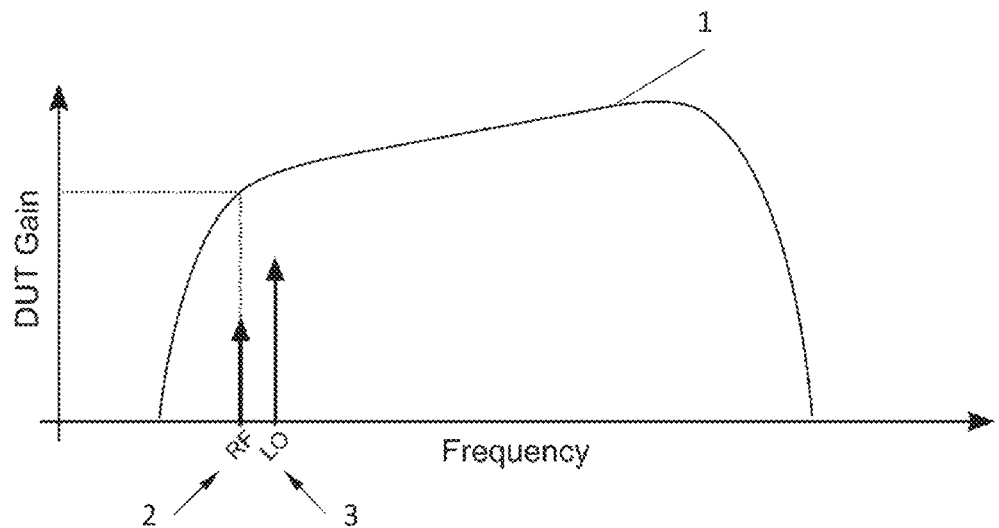
FIG. 1 shows an exemplary gain diagram of a device under test.

FIG. 1 shows an exemplary diagram of a gain response over frequency 1 of a device under test. The depicted curve of the gain response over frequency 1 is obtained from a gain measurement. A radio frequency (RF) signal at a specified frequency and a known signal power is applied to an input terminal of the device under test. The RF signal is amplified or attenuated by the gain factor of the device under test at the specified frequency. The resulting output power is measured. The measured output power in relation to the input power corresponds to the gain of the device under test at the specified frequency. The specified frequency is swept within a desired frequency range with defined frequency steps. The result of these measurements is the depicted gain response over frequency 1 of a device under test.

The measurement of the gain response over frequency 1 is based on a frequency selective power measurement. A converting power measurement device is used to obtain a higher frequency selectivity. The converting power measuring device is based on a heterodyne principle receiver. A heterodyne receiver uses a local oscillator frequency (LO) 3 to convert a radio frequency signal (RF) 2 of interest into an intermediate frequency signal. The intermediate frequency is selected in a manner, wherein the desired measurement bandwidth can be obtained. Low intermediate frequencies enables narrow band measurements, as the IF filter with comprising a narrow bandwidth is less complex at lower intermediate frequencies. The sweep time for the frequency sweep increases as the intermediate frequency bandwidth decreases. A low intermediate frequency receiver principle enhances the precision of a noise power measurement.

Figure 2:
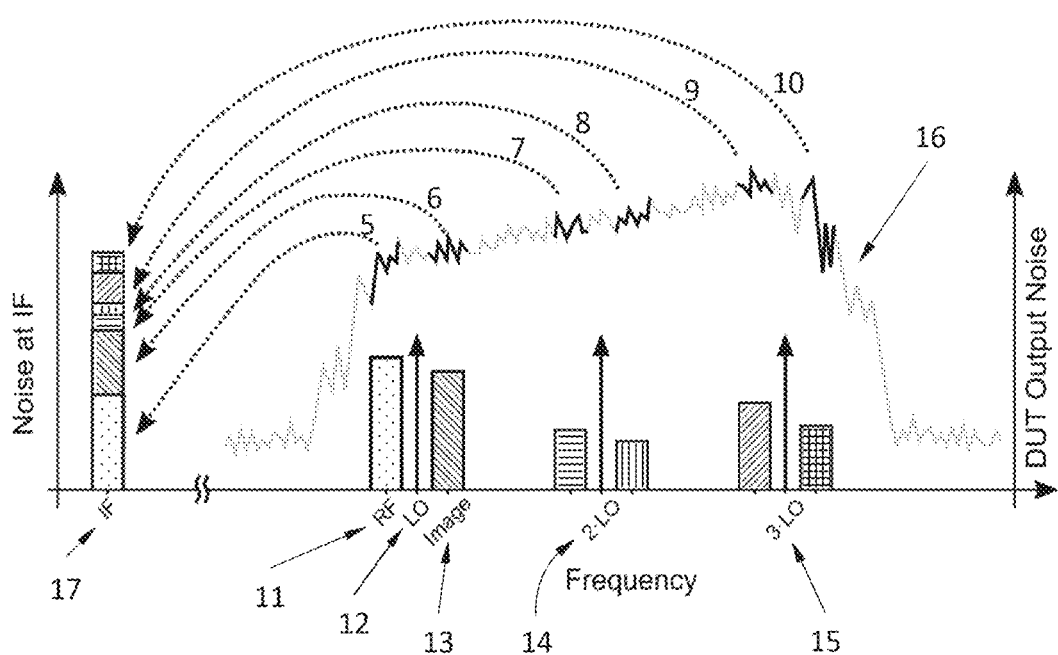
FIG. 2 shows an exemplary diagram of noise power conversion.

FIG. 2 shows an exemplary diagram of noise power conversion. Typically vector network analyzers use receivers without image band suppression. While this is of no issue while measuring gain (because the signal applied for the measurement is only present in one of the sidebands and the signal is significantly stronger than the noise in this sideband), in a noise power measurement both sidebands are inevitable converted onto the same intermediate frequency and cannot be separated afterwards.

In FIG. 2 the RF band 11 is for example chosen to be the lower sideband at the corresponding LO frequency 12. Alternatively, it could also be the upper sideband. If the receiver (and the DUT) have only little difference in frequency response between the lower sideband and the upper sideband it may be sufficient to measure the gain of the receiver only for one of these sidebands (also at 2*LO, 3*LO, ... ) and to assume that the other sideband has the same characteristics. In other words a calibration of the receiver is performed. For example if the intermediate frequency is chosen very low this assumption is valid for a typical device under test. In this case the measured noise power is divided by two and the gain for weighing the sideband (and also the fundamental) is chosen to be the gain of either the lower sideband or the upper sideband at the corresponding LO frequency.

However, as exemplarily shown in FIG. 2 the RF band 11 and the image band 13 might have different receiver characteristics, for example due to a changing gain response of one of the components in the receiver path such as the mixer or a preamplifier. In this case the accuracy of the measurement can be improved if the gain of the receiver is measured in the lower sideband and in the upper sideband. Exemplarily, it is assumed that the noise power N is constant over frequency. In particular, the same noise power is present at the RF 11 and the image frequency 13. Then the noise is downconverted into IF 17. The noise power at IF 17 is composed of Gain@RF*N+Gain@Image*N. As the gain at the image is measured as well, the noise power can be calculated more precisely as N=N_IF/(Gain_RF+Gain_Image). Therefore, for subsequent calculations the measured noise power is divided by the sum of the gain from RF and image frequency The gain used for weighing the sideband (and also the fundamental) is the mean gain of the lower sideband and upper sideband at the corresponding LO frequency.

The diagram depicted in FIG. 2 shows a curve of a measured output noises power 16 of a device under test. The measurement is taken with a selective heterodyne receiver by performing a plurality of frequency sweep steps. In this example, an exemplary conversion for a noise power at desired radio frequency 11 of one of a plurality of frequency sweep steps is shown. The noise power at the desired frequency 11 is converted 5 into an intermediate frequency band (IF). The depicted portion of the noise power at desired radio frequency 11 converted to an intermediate frequency noise signal 17 in this example has a lower level. This lower level results from a gain correction. The converted intermediate frequency noise is dependent on the gain of IF amplifiers attenuators etc. Another portion of the intermediate noise signal is an image noise power 13 of the noise power at the desired frequency 11. The image noise power 13 is converted 6 to the intermediate noise signal by a mixer within the heterodyne receiver.

The heterodyne receiver also converts noise power with a second harmonic frequency 14 of the local oscillator (2 LO) into the intermediate frequency noise signal 17. A noise power at the lower sideband at the second harmonic frequency 14 is converted 7 into an intermediate frequency noise signal 17. Also a noise power at the upper sideband at the second harmonic frequency 14 is converted 8 into an intermediate frequency noise signal 17. A third harmonic frequency 15 of the local oscillator (3 LO) is responsible for converting 9 a noise power at the lower sideband as well as converting 10 a noise power at the upper sideband into an intermediate noise signal 17. All contribute of the noise power converted by the second and third harmonic is scaled by a related gain at the frequency of the noise power from the lower sideband and the upper sideband at the corresponding local oscillator frequency.

The intermediate frequency noise signal 17 comprises portions of the desired radio frequency signal 11 and of the image noise signal 13, the contribute of a noise power resulting of the conversion 7,8 at the second harmonic 14 local oscillator frequency and resulting of the conversion 9,10 at the third harmonic 15 local oscillator frequency. These portions of the image noise signal 13 are removed by the following method.

Figure 3:
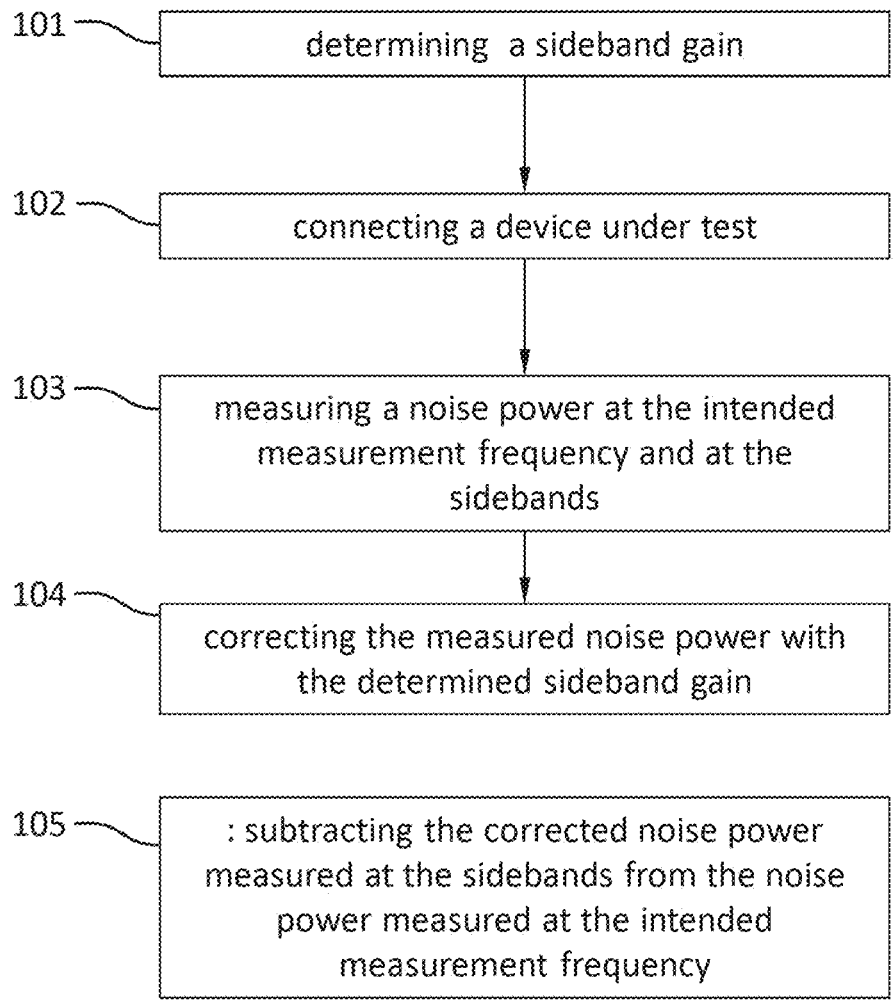
FIG. 3 shows a flow chart for sideband corrected noise-power measurement of an exemplary embodiment of the first aspect of the invention.

FIG. 3 shows a method for sideband corrected noise-power measurement in a flow diagram. In a first step, the sideband gain of the measurement system is determined 101. The sideband gain is the gain of the system in a band of frequencies higher than the carrier frequency or lower than the carrier frequency of a mixing device. Each of the sidebands comprise all the spectral components of a signal symmetrical to the carrier frequency except the carrier signal. The signal components above the carrier frequency constitute the upper sideband, and those below the carrier frequency constitute the lower sideband. The sideband gain is the factor by which the sideband signals are amplified or attenuated. The sideband gain determination 101 is performed in the range of the intended measurement frequency and in the range of at least one sideband of the receiver.

In a next step, a device under test is connected 102 to a measurement system for a sideband corrected noise-power measurement. In a following step, a noise power of the device under test is measured 103 at the intended measurement frequency and at at least one sideband using a T noise power measurement. Therefore, the receiver is tuned to the desired local oscillator frequency of the measurement. The measured noise power comprises the components of the frequency band to be examined as well as the sideband noise power components. The noise at each of the sideband is measured with the receiver. Therefore, the receiver is tuned consecutively to the frequency and the noise power at each of these frequencies is measured.

The measured noise power at the sidebands is weighed with the determined sideband gain 104 in a next step. The measured noise power is then offset against the sideband gain and the measured noise power is reduced by the corresponding amount.

In a next step, the weighed noise power measured at the sidebands is subtracted from the noise power measured at the intended measurement frequency 105. This results in the corrected noise power.

Figure 4:
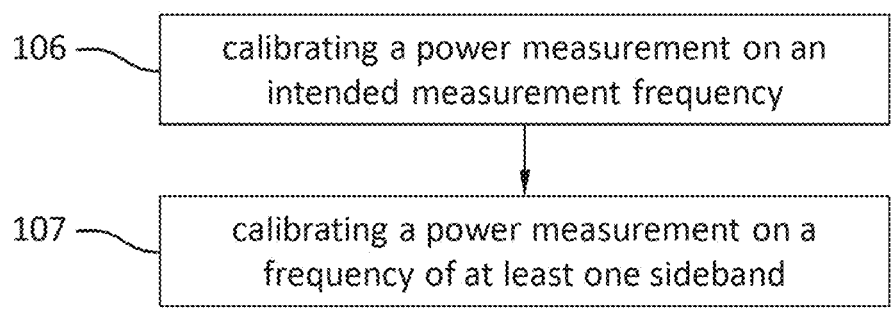
FIG. 4 shows a flow chart for a partial vector calibration of an exemplary embodiment of the first aspect of the invention.

The measurement method further comprises on optional initial step of performing at least a partial vector calibration 106 of the measurement system shown in FIG. 4. This step allows to enhance the measurement performance of the measurement system to a next level.

The partial vector calibrating step is executed as an initial step of the measurement method and comprises calibrating a power measurement on an intended measurement frequency 106 and calibrating a power measurement on a frequency of at least one sideband 107. In a standard calibration it is assumed that the gain at the image band is the same as the gain at the calibrated intended measurement frequency. The partial vector calibration at the intended measurement frequency 106 and at the sideband 107 makes this assumption obsolete as the partial vector calibration allows to remove measurement uncertainties caused by mismatch and therefore enhances the accuracy of the measurement.

Figure 5:
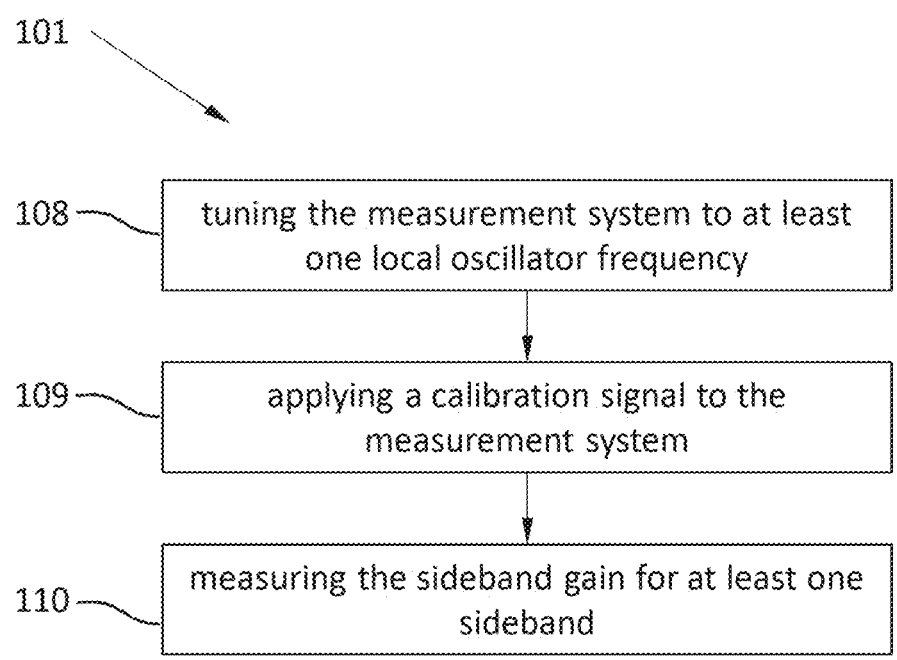
FIG. 5 shows a flow chart of determining the sideband gain of an exemplary embodiment of the first aspect of the invention.

The step of determining the sideband gain 101 may comprise further a tuning 108 of the measurement system to at least one local oscillator frequency as shown in FIG. 5. The at least one local oscillator frequency is tuned in a manner that a measurement is performed at the intended measurement frequency. It has to be noted that the local oscillator frequency comprises a determined frequency offset. This offset is related to a filter configuration of a receiver within the measuring system. At the next step for determining 102 the sideband gain a calibration signal is applied 109 to the measurement system. Therefore, the calibration signal is tuned to at least one sideband frequency. Now, the sideband gain for at least one sideband is measured 110 with the calibration signal applied to the measurement system for each sideband frequency separately. The sideband gain is measured through the whole signal path of the measuring system so that every gain contribute of the system is included. For example, the receiver is fixed at a local oscillator frequency (LO). The tunable frequency generator steps through the different higher order sidebands wherein the frequency the tunable frequency generator is: LO−IF, LO+IF, 2*LO−IF, 2*LO+IF, etc. The gain in each pair of sidebands n*LO−IF and n*LO+IF is measured.

Figure 6:
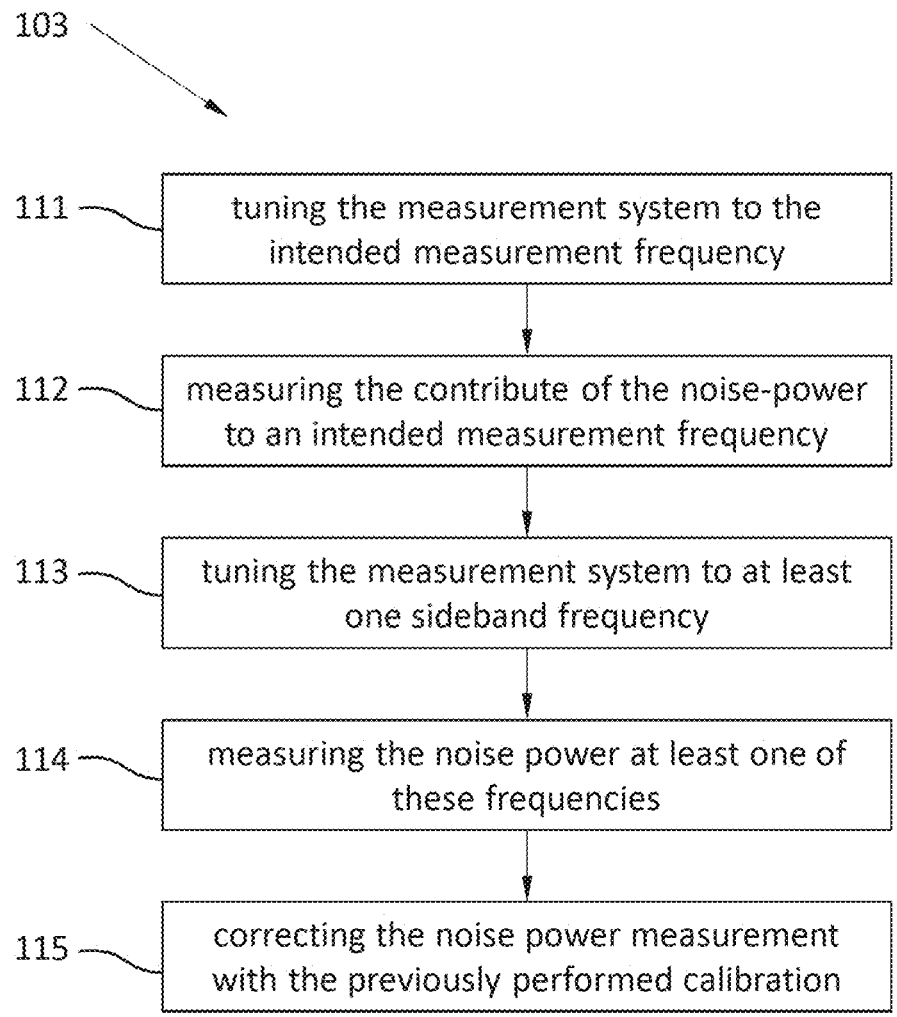
FIG. 6 shows a flow chart of measuring noise power of an exemplary embodiment of the first aspect of the invention.

FIG. 6 shows a flow chart of measuring noise power 103. At a first step, the measurement system is tuned 111 to the intended measurement frequency. After setting the measuring system to the intended measurement frequency, the contribute of the noise-power is measured 112 at the intended measurement frequency. Now, the measurement system is tuned to at least one sideband frequency. The noise power is measured 114 for at least one of these frequencies in a following step. Every single noise component of the sideband noise is determined exactly by performing these steps. For example, the receiver is tuned consecutively to the LO, 2*LO, 3*LO, etc. frequency and the noise power at each of these frequencies is measured. On basis of these results a further improvement of the measurement accuracy can be achieved. For further improvement, the noise power measurement is corrected 115 with the previously performed calibration.

A step of dividing the measured noise power by two may be applied in case of using a non-image suppressing power measurement. This step compensates for the characteristics of virtual noise power doubling that occurs in conjunction with the use of wideband receivers without image suppressing characteristics.

Figure 7:
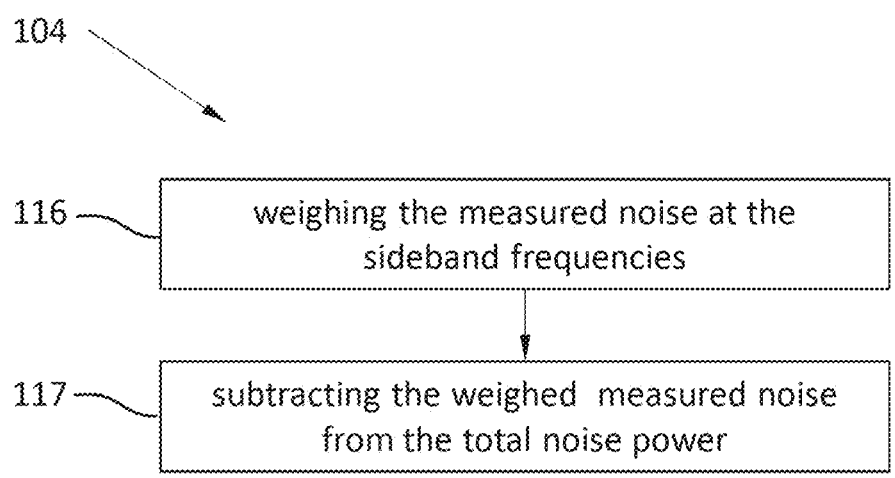
FIG. 7 shows a flow chart of refining the correcting of the measured noise power of an exemplary embodiment of the first aspect of the invention.

FIG. 7 shows a flow chart of refining the correcting of the measured noise power 104. The measured noise power is refined by weighing 116 the measured noise at the sideband frequencies with a mean gain of the corresponding sideband, while the measurement system is focused at an intended measurement frequency. The measured noise at the sideband frequencies weighted in such a manner is subtracted 117 from the total noise power at the intended measurement frequency.

Measuring the sideband corrected noise power may comprise a step of calculating a noise figure of the device under test. The sideband corrected noise power of the device with a termination at the input is measured as described above. The measured gain of the device under test and the noise bandwidth of the measurement system is used to determine the noise factor on the basis of the measured sideband corrected noise power.

Figure 8:
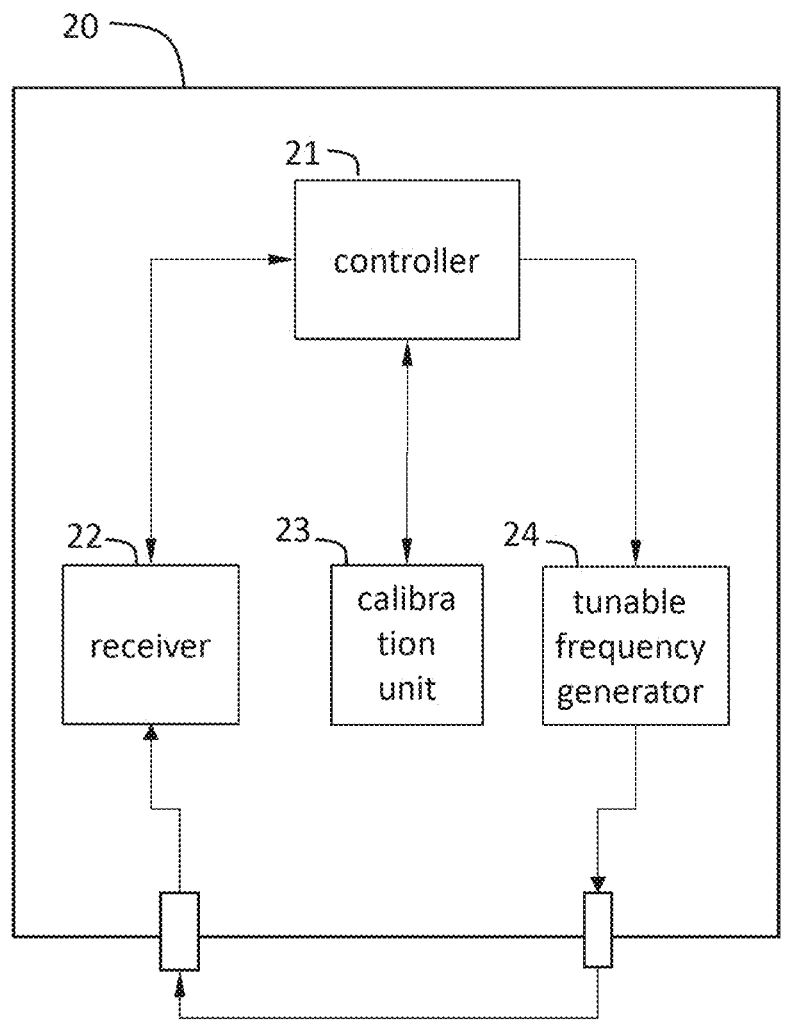
FIG. 8 shows an exemplary embodiment of a measurement system for sideband corrected noise-power measurement in a calibration setup of the second aspect of the invention.

FIG. 8 shows a measurement system 20 for sideband corrected noise-power measurement in a calibration setup. The measurement system 20 comprises a calibration unit 23, a tunable frequency generator 24, a receiver 22 and a controller 21. The calibration unit 23 is configured to determine a sideband gain of the measurement system. The sideband gain is determined by applying a calibration signal to the receiver 22 of the measurement system 20. The sideband gain is the factor by which the sideband signals are amplified or attenuated. The signal components above the carrier frequency constitute the upper sideband, and those below the carrier frequency constitute the lower sideband. The calibration unit is further adapted to perform at least a partial vector calibration of the measurement system. The vector calibration is performed on the intended RF frequency and also on the image band frequency and on the frequencies of the higher order sidebands.

An output port of the tunable frequency generator 24 is connectable to the input port of the receiver 22. The tunable frequency generator 24 is tuned to an intended measurement frequency while measuring a gain of the measuring system at an intended measurement frequency. The tunable frequency generator is tuned to at least one sideband frequency while measuring a sideband gain for at least one sideband of the measuring system at the frequency of the at least one sideband. The sideband is a band of frequencies higher than or lower than the carrier frequency used for mixing in the receiver 22. Each of the sidebands comprise all the spectral components of a signal symmetrical to the carrier frequency except the carrier signal.

The controller 21 in this setup is configured to control the calibration steps of the related method as already described. The controller may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Figure 9:
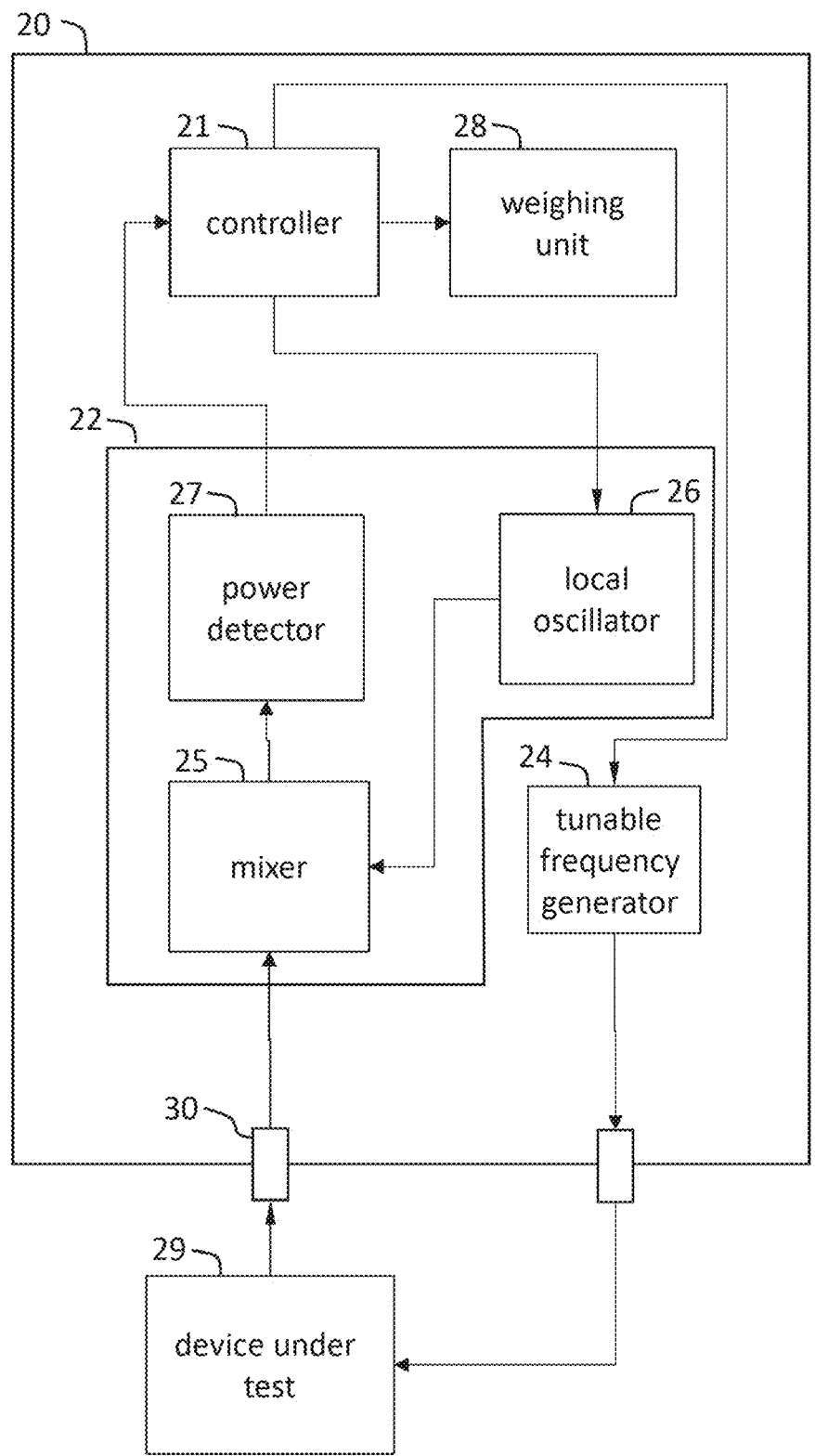
FIG. 9 shows an exemplary embodiment of a measurement system for sideband corrected noise-power measurement in a measurement setup of the second aspect of the invention.

FIG. 9 shows a measurement system 20 for sideband corrected noise-power measurement in a measurement setup.

The measurement system 20 comprises a controller 21, a receiver 22, a tunable frequency generator 24 and weighing unit 28. The calibration unit 23 is not depicted for a better overview as it is idle while measuring. The controller 21 controls the measuring steps and is further configured to perform the correcting of the noise power measurement in the measurement setup.

The receiver 22 of the measurement system 20 comprises a mixer 25, a local oscillator 26 and a power detector 27. The mixer 25 has a first input, a second input and an output. The first input of the mixer 25 is connectable to a device under test 29 through a port 30. The first input of the mixer acts as an input port of the receiver 22. This is the terminal where the calibration unit 23 or the device under test 29 is connect dependent on the setup. The first input of the mixer 25 may be equipped with an ultra-low noise preamplifier. The ultra-low noise preamplifier enables the measurement system to detect an extremely low noise component of the device under test 29. The second port of the mixer 25 is connected to the local oscillator 26. The mixer 25 shifts the signal of the first input from one frequency range to another frequency range in dependence to the frequency of the local oscillator 26. Therefore, the frequency of the local oscillator 26 is tuned by the controller. The output of the mixer 25 is connected to a power detector 27.

The local oscillator 26 is tunable in dependence of the measurement task of the receiver. The frequency of the local oscillator 26 is swept within a predetermined frequency band for measuring a gain response. Herein, the frequency of the local oscillator 26 follows the frequency of the tunable frequency generator 24. A frequency offset of the local oscillator frequency is stet to transfer the received signal tunable frequency generator 24 into a suitable intermediate frequency of the receiver 22.

The calibration of measurement system 20 is based on at least two local oscillator 26 settings. Measuring a gain at an intended measurement frequency is executed in a setting, wherein the local oscillator 26 of the receiver 22 is tuned to a frequency corresponding to the intended measurement frequency while measuring the contribute of the noise power at the intended measurement frequency. The further settings are used for measuring a sideband gain. For measuring a sideband gain the local oscillator of the receiver is tuned to a frequency corresponding to at least one sideband frequency while measuring the contribute of the noise-power at the sideband frequency.

During a noise power measurement the local oscillator 26 of the receiver 22 is tuned to a frequency corresponding to the intended measurement frequency while measuring the noise power at the intended measurement frequency.

The power detector 27 of the receiver 22 is connected to the output of the mixer 25 and is configured to measure a noise power of a device under test 29. The intermediate frequency signal of the mixer 25 is provided to the power detector 27. The power detector 27 converts the intermediate frequency signal to a signal representing a power level. The power detection is based on an average detection and/or a root means square (RMS) detection and/or a maximum peak detection or a minimum level detection. The power detector 27 may be implemented by one or more thermistors, thermocouples, diodes, analog to digital converters or the like.

The output signal of the power detector 27 is transmitted to the controller 21. The controller 21 is configured to correct the noise power measurement of the receiver 22, when the receiver 22 has no image suppressing capabilities by performing a division by two of the measured noise power. This correction scheme is selected for a precision measurement. The controller 21 is configured to correct the noise power measurement at the intended frequency by the contribute of the noise-power at the sideband frequency on the basis of the measured sideband gain. For a standard precision measurement it is assumed that the gain in each pair of sidebands is equal. For a high accuracy measurement the mean value of the individual gain measurements of each sideband pair is used for the correction. For the mean value the division by two can be done easily by bit shifting. It can be omitted if S-parameters are calculated as the value of 2 is cancelled by the ratio of the forward and backward wave.

The controller may use the corrected measured noise power to calculate a noise figure of the device under test 29. The device under test 29 is further connectable to the tunable frequency generator 24 to perform noise measurements on basis of a direct signal to noise measurement.

So, in other words we could either divide the measured noise power by two and use the gain of the RF frequency or we divide the measured noise power by the sum of the gain from RF and image frequency. It is therefore never an option to only divide the measured noise power by two and not to use the sideband gain. It is rather the decision between using only the gain of the RF frequency and assuming the image frequency has the identical gain or to specifically measure the gain also at the image frequency.

The measurement system 20 may further comprise a weighing unit 28. The weighing unit 28 receives the measured noise at the sideband frequencies the total noise power at the intended measurement frequency from the controller 28. The measured noise at the sideband frequencies is weighed with the mean gain of the corresponding sideband by the weighing unit 28. The weighing unit performs a subtraction of the weighed measured noise at the sideband frequencies from the total noise power at the intended measurement frequency.

Figure 10:
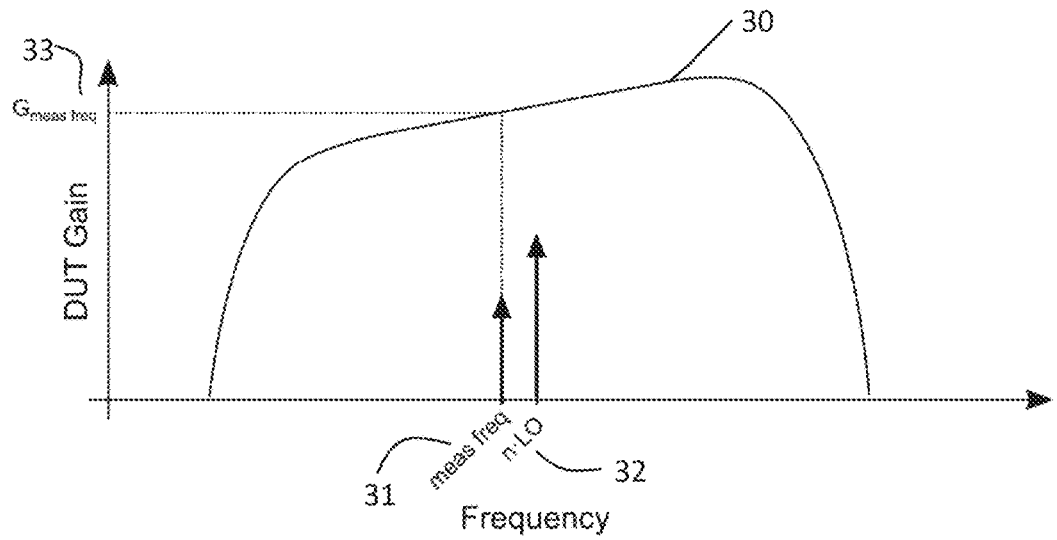
FIG. 10 shows an exemplary gain response over frequency of a device under test.

FIG. 10 shows an exemplary diagram of a gain response over frequency 30 of a device under test. The gain response over frequency 30 is measured by applying a measurement frequency signal 31. The frequency and signal power of the measurement frequency signal are specified with respect to the measurement of interest. The measurement frequency signal 31 is applied to the device under test, wherein the measurement frequency signal is amplified or attenuated by the gain factor of the device under test. The resulting output power of the device under test is measured and the gain 33 is calculated.

The measurement of the gain response over frequency 30 is measured using a frequency converting receiver. The frequency converting receiver uses a local oscillator as a frequency source for the mixer. The output frequency 32 of the frequency source might be a fundamental frequency (1*LO), any harmonic frequency (n*LO) or any subharmonic frequency ((n−1)*LO).

Figure 11:
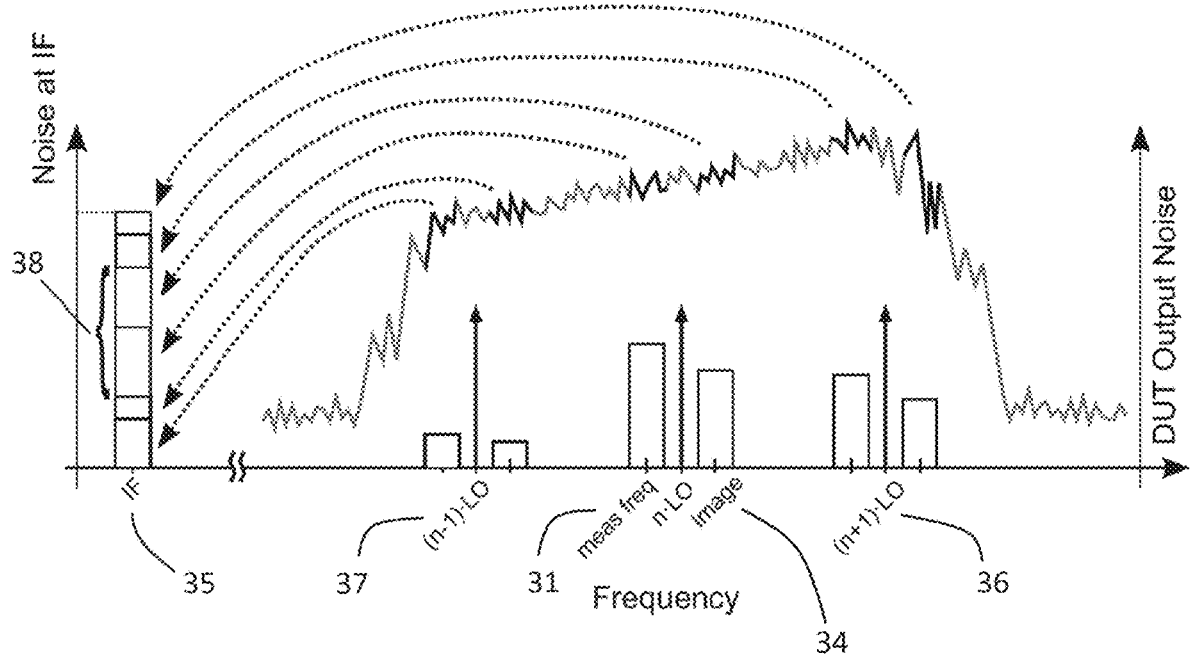
FIG. 11 shows an exemplary diagram of noise power conversion comprising subharmonics.

FIG. 11 shows an exemplary diagram of noise power conversion over frequency. This is a typical signal distribution of signals within vector network analyzers using frequency converting receivers without image band suppression. The lack of image suppression affects the gain measurement negligible, because the signal applied for the measurement is only present in one of the sidebands and the signal is significantly stronger than the noise in this sideband. But in a noise power measurement both sidebands are inevitable converted into the same intermediate frequency and cannot be separated afterwards.

However, as exemplarily shown in FIG. 11 the frequency band of the measurement frequency 31 and the image band 34 might have different noise levels. The differences might be caused by a changing gain response of one of the components in the receiver path such as the mixer or a preamplifier. In this case the accuracy of the measurement can be improved if the gain of the receiver is measured in the lower sideband at the measurement frequency 31 and in the upper sideband at the image band 34. For subsequent calculations the noise power is then also divided by two. To enhance the accuracy, the gain used for weighing the sideband and also the fundamental is the mean gain of the lower sideband and upper sideband at the corresponding LO frequency.

The diagram FIG. 11 shows an exemplary conversion for a noise power at the desired frequency 31 and a related image noise power the image band 34 into an intermediate frequency band (IF) 35 as a noise from the measurement frequency band 38. The converting receiver also converts noise power with a further harmonic frequency 36 of the local oscillator ((n+1)*LO) into the intermediate frequency noise signal 35. A noise power at the lower sideband at the further harmonic frequency 36 is converted into an intermediate frequency noise signal 35. Also a noise power at the upper sideband at the further harmonic frequency 36 is converted into an intermediate frequency noise signal 35. A sub harmonic frequency 37 of the local oscillator ((n−1)*LO) is responsible for converting a corresponding noise power at the lower sideband as well as a noise power at the upper sideband into the intermediate frequency noise signal 35.

Thus, the intermediate frequency noise signal 36 comprises portions of the desired radio frequency signal 31 and of the image noise signal 34, an upper and lower sideband noise power resulting of the conversion at the harmonic local oscillator frequencies 36 and an upper and lower sideband noise power resulting of the conversion at the subharmonic local oscillator frequencies 37. These portions of the image noise signal 13 are removed by the above mentioned method. The noise power resulting from conversion by sub harmonic frequencies 37 of the local oscillator ((n−1)*LO) are removed analogous to the noise power resulting from conversion with the harmonic frequencies 36 of the local oscillator ((n+1)*LO).

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement method for sideband corrected noise-power measurement, the method comprising the steps of:
    determining a sideband gain of a measurement system;
    measuring a noise power of a device under test connected to the measurement system at an intended measurement frequency and in at least one sideband; and correcting the measured noise power with the measured noise power in the at least one sideband and the determined sideband gain; and wherein the correcting of the measured noise power comprises weighting the measured noise at the sideband frequencies with a mean gain of the corresponding sideband while the measurement system is focused at an intended measurement frequency, and subtracting the weighted measured noise at the sideband frequencies from the total noise power at the intended measurement frequency.

2. The measurement method according to claim 1, wherein the method further comprises the step of:
performing at least a partial vector calibration of the measurement system.

3. The measurement method according to claim 2, wherein the partial vector calibrating step comprises the steps of:
calibrating a power measurement at an intended measurement frequency; and
calibrating a power measurement at a frequency of at least one sideband.

4. The measurement method according to claim 1, wherein the determining of the sideband gain step comprises the steps of:
tuning the measurement system to at least one local oscillator frequency, wherein the at least one local oscillator frequency is tuned for the intended measurement frequency;
applying a calibration signal to the measurement system, wherein the calibration signal is tuned to at least one sideband frequency; and
measuring the sideband gain for at least one sideband at at least one sideband frequency.

5. The measurement method according to claim 1, wherein the measuring of the noise power step comprises the steps of:
tuning the measurement system to the intended measurement frequency;
measuring the noise-power at the intended measurement frequency;
tuning the measurement system to at least one sideband frequency; and
measuring the noise power at at least one of these frequencies.

6. The measurement method according to claim 1, wherein the measuring of the noise power step comprises the step of:
correcting the noise power measurement with the previously performed calibration.

7. The measurement method according to claim 1, wherein the measuring of the noise power step comprises the step of:
correcting the noise power measurement without image suppression by dividing the measured noise power by two.

8. The measurement method according to claim 1, wherein the corrected noise power measurement is used to calculate a noise figure of the device under test.

9. A measurement system for sideband corrected noise-power measurement, comprising:
a calibration unit configured to determine a sideband gain of the measurement system;
a tunable frequency generator;
a receiver configured to measure a noise power of the device under test in at least one sideband; and
a controller configured to correct the noise power with the measured noise power in the at least one sideband, wherein the correcting of the noise power comprises weighting the measured noise at the sideband frequencies with the mean gain of the corresponding sideband while the measurement system was focused at the intended measurement frequency, and subtracting the weighted measured noise at the sideband frequencies from the total noise power at the intended measurement frequency.

10. The measurement system according to claim 9, wherein the calibration unit is adapted to perform at least a partial vector calibration of the measurement system.

11. The measurement system according to claim 9, wherein the receiver comprises:
a mixer having a first input, a second input and an output;
a local oscillator, wherein the local oscillator frequency is tuned by a controller; and
a power detector; and
wherein the first port of the mixer is connectable to a device under test,
wherein the second port of the mixer is connected to the local oscillator, and
wherein the output port is connected to the power detector.

12. The measurement system according to claim 9, wherein:
an output port of the tunable frequency generator is connectable to the first input port of the mixer,
the tunable frequency generator is tuned to an intended measurement frequency while measuring a gain of the measuring system at an intended measurement frequency, or
the tunable frequency generator is tuned to at least one sideband frequency while measuring a sideband gain for at least one sideband of the measuring system at the frequency of the at least one sideband.

13. The measurement system according to claim 9, wherein:
the local oscillator of the receiver is tuned to a frequency corresponding to the intended measurement frequency while measuring noise power at the intended measurement frequency; or
the local oscillator of the receiver is tuned to a frequency corresponding to at least one sideband frequency while measuring the noise-power at the sideband frequency.

14. The measurement system according to claim 9, wherein the controller is configured to correct the noise power measurement at the intended frequency by the contribution of the noise power at the sideband frequency on the basis of the measured sideband gain.

15. The measurement system according to claim 9, wherein the controller is configured to correct the noise power measurement of the receiver being a non-image suppressing receiver by dividing the measured noise power by two.

16. The measurement system according to claim 9, wherein the controller is configured to calculate a noise figure of the device under test.

* * * * *